United States Patent
Ponton et al.

(10) Patent No.: US 11,082,058 B2
(45) Date of Patent: Aug. 3, 2021

(54) CONCEPT OF CAPACITOR SCALING

(71) Applicant: Apple Inc., Cupertino, CA (US)

(72) Inventors: Davide Ponton, Warmbad-Villach (AT); Antonio Passamani, Kartnen (AT)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/976,683

(22) PCT Filed: Mar. 29, 2018

(86) PCT No.: PCT/US2018/024983
§ 371 (c)(1),
(2) Date: Aug. 28, 2020

(87) PCT Pub. No.: WO2019/190512
PCT Pub. Date: Oct. 3, 2019

(65) Prior Publication Data
US 2021/0006259 A1 Jan. 7, 2021

(51) Int. Cl.
*H03M 1/80* (2006.01)

(52) U.S. Cl.
CPC .................. *H03M 1/802* (2013.01)

(58) Field of Classification Search
CPC .................................................. H03M 1/802
USPC ........................................ 341/144–145, 150
See application file for complete search history.

(56) References Cited

U.S. PATENT DOCUMENTS

| | | | |
|---|---|---|---|
| 6,747,583 B2* | 6/2004 | Tucholski | H03M 1/06 341/118 |
| 9,118,346 B2* | 8/2015 | Courcy | H03M 1/747 |
| 2006/0125670 A1 | 6/2006 | Cho et al. | |
| 2012/0081243 A1 | 4/2012 | Kim et al. | |
| 2014/0253354 A1 | 9/2014 | Quiquempoix | |
| 2016/0065131 A1 | 3/2016 | Pavao-Moreira et al. | |

FOREIGN PATENT DOCUMENTS

EP 2779444 B1 12/2017

OTHER PUBLICATIONS

International Search Report and Written Opinion for International Application No. PCT/US2018/024983, dated Jan. 2, 2019, 8 pgs.

* cited by examiner

*Primary Examiner* — Khai M Nguyen
(74) *Attorney, Agent, or Firm* — Kowert, Hood, Munyon, Rankin & Goetzel, P.C.

(57) ABSTRACT

The present disclosure addresses a concept for capacitor scaling. A first capacitor is provided with a first signal capacitance between a first electrode and a second electrode of the first capacitor and with a first parasitic capacitance between the first capacitor's first electrode and AC ground. A sum of the first signal capacitance and the first parasitic capacitance yields a first total capacitance. A second capacitor is provided with a second signal capacitance between a first electrode and a second electrode of the second capacitor and with a second parasitic capacitance between the second capacitor's first electrode and AC ground. A sum of the second signal capacitance and the second parasitic capacitance yields a second total capacitance. While the first signal capacitance differs from the second signal capacitance, the first total capacitance equals the second total capacitance.

20 Claims, 11 Drawing Sheets

CONCEPT OF CAPACITOR SCALING

FIELD

Example implementations addressed by the present disclosure generally relate to scaling signal capacitances of capacitors in electrical circuits. Examples of such circuits are data conversion circuits, such as digital-to-analog converters (DACs) or analog-to-digital converters (ADCs).

BACKGROUND

Many electrical circuits employ capacitors. Examples of electrical circuits employing capacitors are conversion circuits that convert signals from the digital to analog domain (DACs) or, vice versa, from the analog to digital domain (ADCs). High speed data conversion circuits can be used in communications applications and can be found in much of the equipment that forms the basis of our connected world, from cellular base stations to cable headend equipment to radar and specialized communication systems. Recent technological advances have enabled clock rates on high speed data converters to move to higher and higher frequencies. Recently, capacitive radio frequency DACs (RFDACs) became a widespread architecture. A trade-off between linearity, far-off-noise and semiconductor area occupation can be achieved by means of segmentation.

When there is a need to design a DAC with a specific performance, it may well be that no single architecture is ideal. In such cases, two or more DACs may be combined in a single higher resolution DAC to give the required performance. These DACs may be of the same type or of different types and need not each have the same resolution. In principle, one DAC can handle the most significant bits (MSBs), another can handle the least significant bits (LSBs), and their outputs can be added in some way. The process is known as segmentation, and these more complex structures are called segmented DACs.

In particular for capacitive DACs there may be a need to differently scale capacitors of different DAC cells. Also for other electrical circuits there may be such need, which is addressed by the embodiments in the present disclosure.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1A:
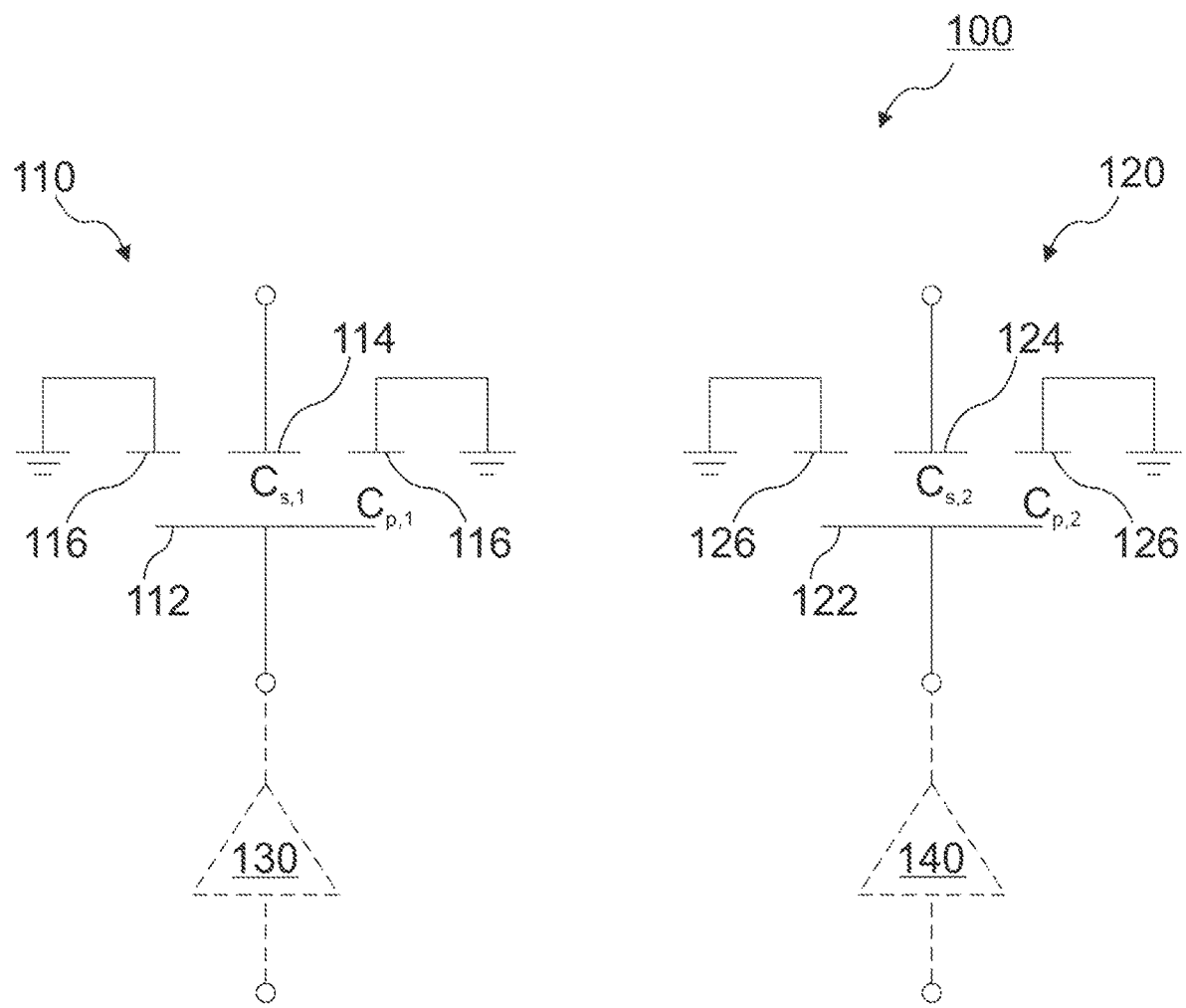
FIG. 1a shows an electrical circuit comprising a plurality of capacitors scaled in accordance with the present disclosure.

FIG. 1a illustrates a schematic of an electrical circuit 100 in accordance with examples of the present disclosure.

Electrical circuit 100 comprises a first capacitor 110 which exhibits a first signal capacitance $C_{s,1}$ between a first electrode 112 and a second electrode 114 of the first capacitor 110. The first signal capacitance $C_{s,1}$ contributes to the first capacitor's transfer function or impedance between its first and second electrodes 112, 114. The first capacitor 110 also exhibits a first additional or parasitic capacitance $C_{p,1}$ between the first capacitor's first electrode 112 and ground, more particularly ac ground 116 (ac=alternating current). In some embodiments, $C_{p,1}$ may be close to zero or even be zero. The skilled person having benefit from the present disclosure will appreciate that ac ground 116 denotes a terminal with constant electric potential. While ac ground 116 can correspond to earth connection, it does not necessarily have to. A sum of the first signal capacitance $C_{s,1}$ and the first parasitic capacitance $C_{p,1}$ yields a first total capacitance $C_{tot,1}$ of the first capacitor 110 "seen" from its first electrode 112, when the second electrode 114 or a portion thereof is connected to ac ground 116. If the first electrode 112 acts as input electrode or terminal, the first total capacitance $C_{tot,1}$ may affect the first capacitor's input impedance according to $1/j\omega C_{tot,1}$.

Electrical circuit 100 also comprises a second capacitor 120 which exhibits a second signal capacitance $C_{s,2}$ between a first electrode 122 and a second electrode 124 of the second capacitor 120. The second signal capacitance $C_{s,2}$ contributes to the second capacitor's transfer function or impedance between its first and second electrodes 122, 124. The second capacitor 120 also exhibits a second additional or parasitic capacitance $C_{p,2}$ between the second capacitor's first electrode 122 and ac ground 126. A sum of the second signal capacitance $C_{s,2}$ and the second parasitic capacitance $C_{p,2}$ yields a second total capacitance $C_{tot,2}$ of the second capacitor 120 "seen" from its first electrode 122, when the second electrode 124 or a portion thereof is connected to ac ground 126. If the first electrode 122 acts as input electrode or terminal, the second total capacitance $C_{tot,2}$ may affect the second capacitor's input impedance according to $1/j\omega C_{tot,2}$.

The first capacitor 110 and the second capacitor 120 can be implemented such that the first signal capacitance $C_{s,1}$ of the first capacitor 110 differs from the second signal capacitance $C_{s,2}$ of the second capacitor 120 while the first capacitor's first total capacitance Goo equals or matches the second capacitor's second total capacitance $C_{tot,2}$. In other words, the first and the second capacitor's input impedance is identical (at a given signal frequency $f=\omega/2\pi$) while their respective effective signal capacitances $C_{s,1}$, $C_{s,2}$ are not. The skilled person having benefit from the present disclosure will appreciate that "identical" or "equal" is supposed to be understood as identical or equal within unavoidable manufacturing tolerances. Thus, in real implementations there could be a mismatch or deviation of 2.5%, 5% or even 10% between the first total capacitance Goo and the second total capacitance $C_{tot,2}$.

The proposed capacitor scaling concept may allow to use signal drivers of identical drive strength for both capacitors 110 and 120. Signal drivers include voltage, current, or charge drivers and can be implemented as various active devices. In semiconductor processing, signal drivers of identical drive strength can be obtained by implementing respective circuit structures of identical size, for example. In this context, FIG. 1 also illustrates an optional first signal driver 130 and an optional second signal driver 140. The first electrode (input electrode) 112 of the first capacitor 110 is coupled to the first signal driver 130. Likewise, the first electrode (input electrode) 122 of the second capacitor 120 is coupled to the second signal driver 140. The first and the second signal driver 130 and 140 have identical drive strengths. In other words, the first and the second signal driver 130 and 140 provide identical output signals, given identical input signals. As mentioned above, identical drive strength can be obtained by implementing the first and the second signal driver 130 and 140 with identical physical dimensions, for example. Also here the skilled person having benefit from the present disclosure will appreciate that "identical" is supposed to be understood as identical within unavoidable manufacturing tolerances.

While the proposed concept can generally be applied to many kinds of electrical circuits, the electrical circuit 100 can be a digital-to-analog converter (DAC) circuit, in particular a capacitive DAC, in some example implementations. In such examples, the first capacitor 110 can correspond to a first capacitor cell of the capacitive DAC with signal capacitance $C_{s,1}$, while the second capacitor 120 can correspond to a second capacitor cell of the capacitive DAC with different signal capacitance $C_{s,2}$. Despite the different signal capacitances, identical signal drivers can be used for both capacitor cells. This can have benefits with respect to a phase alignment of the output signals of the various capacitor cells.

Figure 1B:
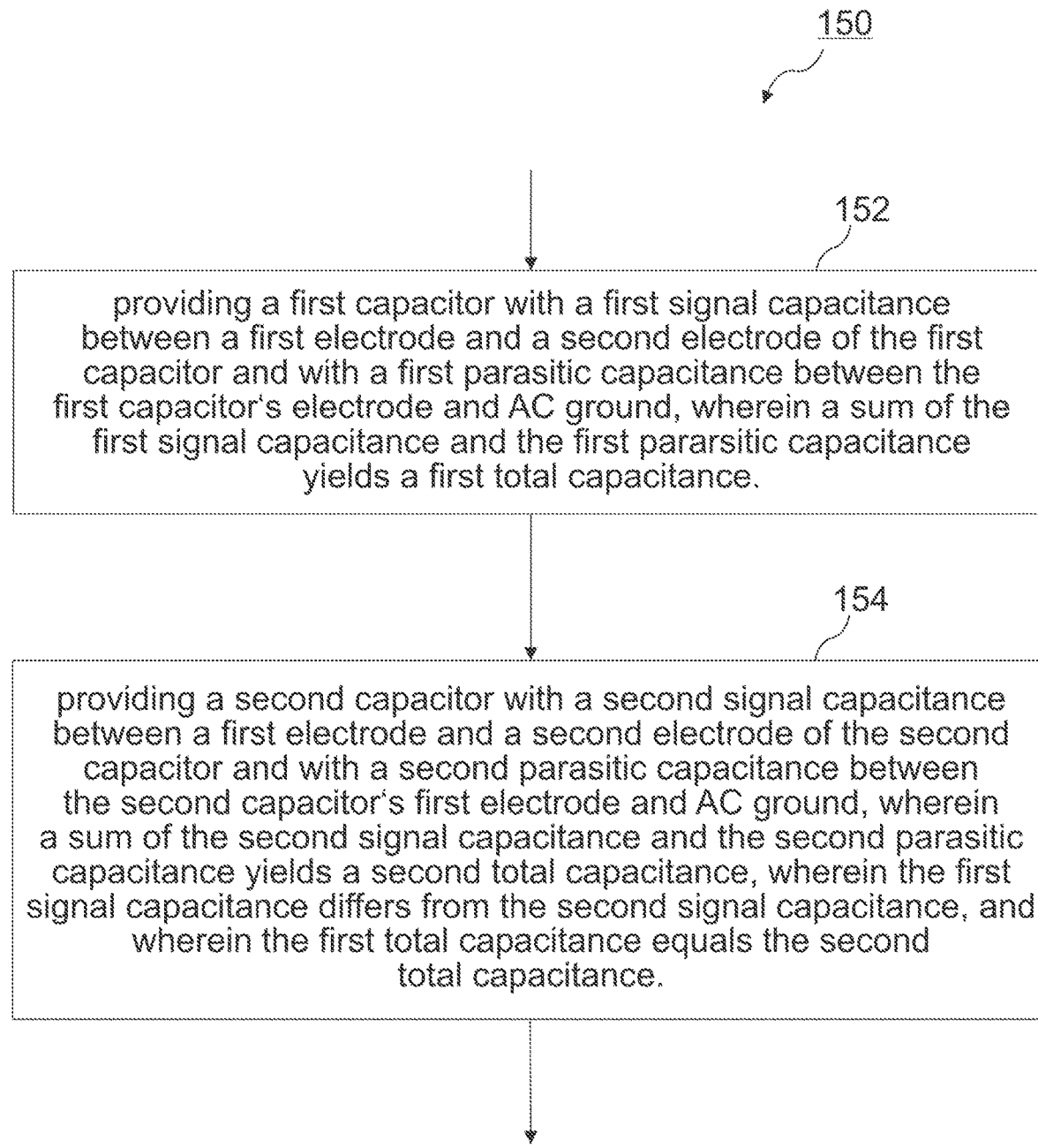
FIG. 1b shows a method of scaling a plurality of capacitors in accordance with the present disclosure.

FIG. 1b illustrates a flowchart of a corresponding method 150 for implementing an electrical circuit.

The method 150 includes an act 152 of implementing a first capacitor with a first signal capacitance between a first electrode and a second electrode of the first capacitor. The first capacitor also may have a first parasitic capacitance between the first capacitor's first electrode and ac ground. A sum of the first signal capacitance and the first parasitic capacitance yields a first total capacitance. Method 150 further includes an act 154 of implementing a second capacitor with a second signal capacitance between a first electrode and a second electrode of the second capacitor. The second capacitor also may have a second parasitic capacitance between the second capacitor's first electrode and ac ground. A sum of the second signal capacitance and the second parasitic capacitance yields a second total capacitance. The method is characterized in that the first and second capacitor are implemented to cause the first signal capacitance to be different from the second signal capacitance while the first total capacitance equals the second total capacitance.

Figure 2:
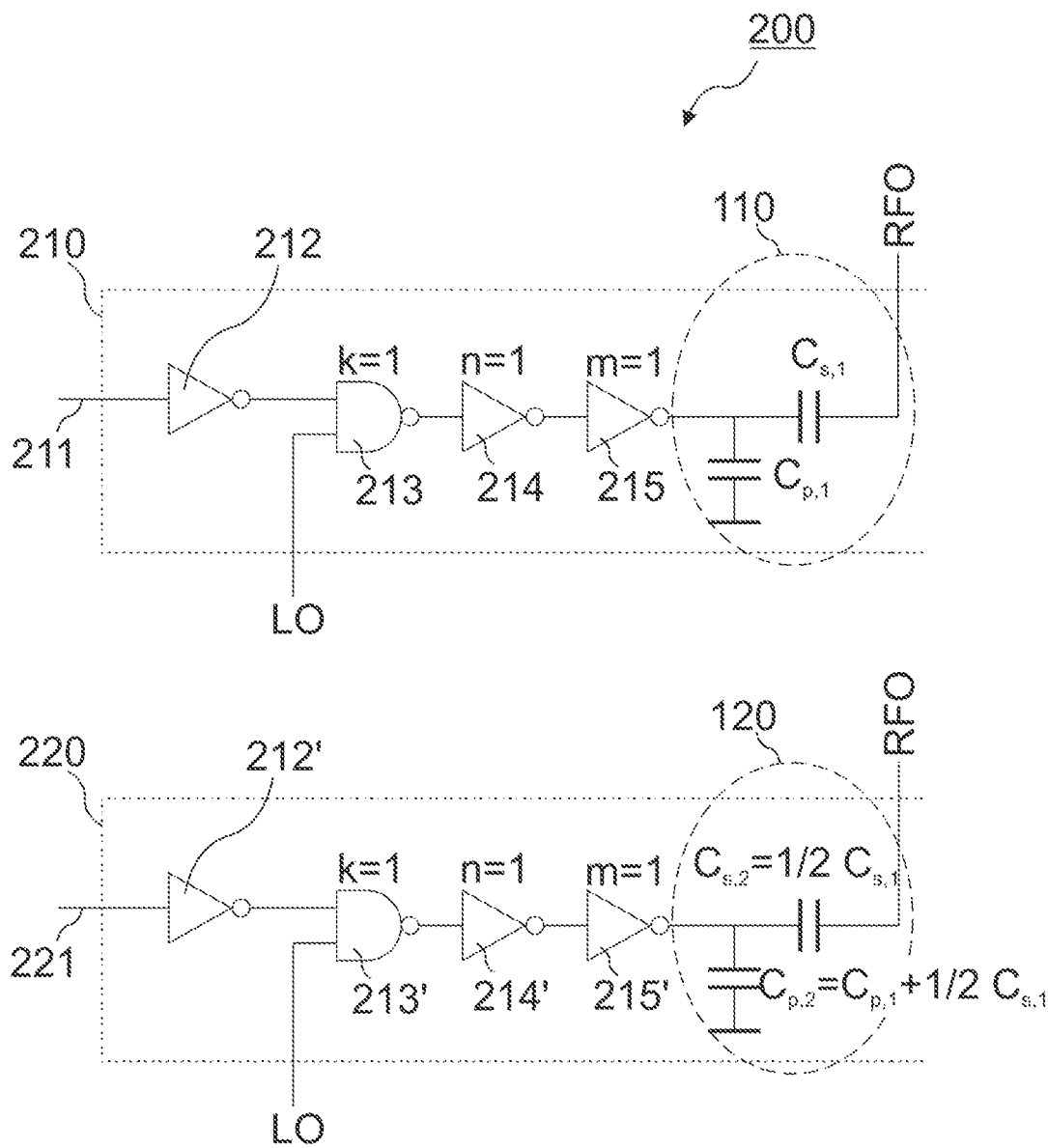
FIG. 2 shows a first and a second cell of a capacitive binary DAC.

FIG. 2 shows an example where the proposed concept is applied to a binary weighted capacitive DAC. The illustrated data conversion circuit 200 comprises a first cell 210 and a second cell 220. The skilled person having benefit from the present disclosure will appreciate that binary weighted capacitive DACs are only an example and that the proposed capacitor scaling concept is not limited to such implementations.

A first signal driver 212 of the first cell 210 receives a binary input 211. The output of the first signal driver 212 is combined with a clock or local oscillator (LO) signal via a logic gate 213. The output of the logic gate 213 is fed to an optional second signal driver 214 and further to a third signal driver 215 driving electrical charges to a first capacitor 110. The first capacitor 110 has a first signal capacitance of $C_{s,1}$ between its input and output terminals as well as a first parasitic capacitance $C_{p,1}$ between its input terminal and ac ground such that the third signal driver 215 "sees" a first total capacitance of $C_{tot,1}=C_{s,1}+C_{p,1}$. In some embodiments, $C_{p,1}$ may be close to or even be zero. The skilled person having benefit from the present disclosure will appreciate that k, n, and m indicate driver strengths.

The second cell is implemented similarly with identical signal drivers and only differs in that the third signal driver 215' is driving a different second capacitor 120. In the illustrated example, the second capacitor 120 has a second signal capacitance of $C_{s,2}=C_{s,1}/2$ between its input and output terminals and a second parasitic capacitance of $C_{p,2}=C_{p,1}+C_{s,1}/2$ between its input terminal and ac ground. Therefore the third signal driver 215 of the second cell 220 "sees" a second total capacitance of $C_{tot,2}=C_{s,2}+C_{p,2}=C_{s,1}/2+C_{p,1}+C_{s,1}/2=C_{s,1}+C_{p,1}=C_{tot,1}$. Thus, the first and second total capacitances Goo and $C_{tot,2}$ are equal while the first and second signal capacitance $C_{s,1}$ and $C_{s,2}$ differ from each other. This can be achieved by designing the first and second parasitic capacitances $C_{p,1}$ and $C_{p,2}$ differently. The difference of the parasitic capacitances $C_{p,1}$ and $C_{p,2}$ also corresponds to the difference of the signal capacitances $C_{s,1}$ and $C_{s,2}$. In the illustrated example, the second signal capacitance $C_{s,2}$ is smaller by $C_{s,1}/2$ compared to the first signal capacitance $C_{s,1}$. Therefore the second parasitic capacitance $C_{p,2}$ is made larger by $C_{s,1}/2$ compared to the first parasitic capacitance $C_{p,1}$, yielding identical first and second total capacitances Goo and $C_{tot,2}$.

Due to the identical first and second total capacitances Goo and $C_{tot,2}$ forming identical loads, the (active) signal drivers of both cells 210, 220 can be implemented with identical drive strength as well. Thus, a physical size of signal driver 212 of the first cell 210 can correspond to a physical size of signal driver 212' of the second cell 220. A physical size of logic gate 213 of the first cell 210 can correspond to a physical size of logic gate 213' of the second cell 220. A physical size of signal driver 214 of the first cell 210 can correspond to a physical size of signal driver 214' of the second cell 220. Likewise, a physical size of signal driver 215 of the first cell 210 can correspond to a physical size of signal driver 215' of the second cell 220.

Identical signal driver strengths between the cells 210 and 220 can positively affect phase alignment of the output signals RFO generated by the cells 210, 220. Well phase aligned output signals of the cells can again positively affect the linearity of the RF transceiver circuits employing capacitive data conversion circuits, often evaluated in terms of error vector magnitude (EVM) and adjacent channel leakage ratio (ACLR). Thus, the skilled person having benefit of the present disclosure will appreciate that the proposed capacitor scaling concept can be implemented in RF transceiver circuits and can improve various performance measures. Examples would be LTE transceiver circuits or transceiver circuits in accordance with other present and future mobile communication standards.

The skilled person having benefit from the present disclosure will appreciate that there are various known ways of implementing capacitors, for example depending on whether discrete or integrated circuits are used. Accordingly, there are also various ways of implementing the first capacitor 110 and the second capacitor 120 such that the first signal capacitance $C_{s,1}$ of the first capacitor 110 differs from the second signal capacitance $C_{s,2}$ of the second capacitor 120 while the first capacitor's first total capacitance $C_{tot,1}$ equals the second capacitor's second total capacitance $C_{tot,2}$.

Figure 3:
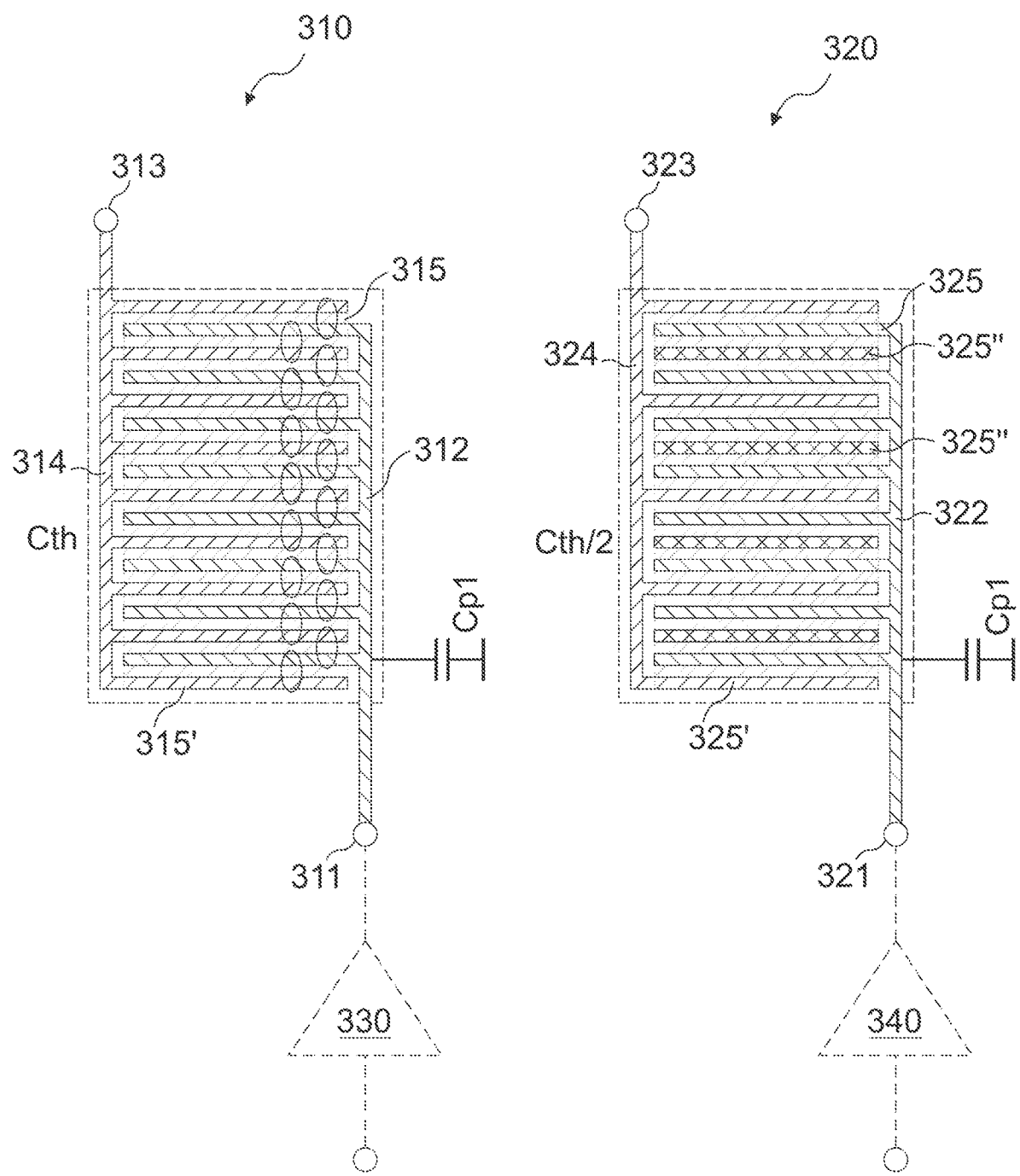
FIG. 3 shows an electrical circuit comprising a plurality of multi-finger capacitors scaled in accordance with the present disclosure.

One example implementation relates to multi-finger capacitor design and is illustrated in FIG. 3. The electrical circuit 300 of FIG. 3 comprises a first capacitor implemented as a first multi-finger capacitor 310 and a second capacitor implemented as a second multi-finger capacitor 320.

The first multi-finger capacitor 310 comprises a first signal terminal 311 coupled to the first multi-finger capacitor's first electrode/plate 312 and a second signal terminal 313 coupled to the first multi-finger capacitor's second electrode 314. Likewise, the second multi-finger capacitor 320 comprises a first signal terminal 321 coupled to the second multi-finger capacitor's first electrode 322 and a second signal terminal 323 coupled to the second multi-finger capacitor's second electrode 324. The first multi-finger capacitor 310 and the second multi-finger capacitor 320 comprise an identical number of respective interdigitating or interleaving first and second fingers between the respective first and second terminals 311, 313 and 321, 323. The skilled person having benefit from the present disclosure will appreciate that the interdigitating first and second fingers can be made of metal, polysilicon or other conductive materials used in semiconductor processing, for example. Dielectric material can be placed in between a pair of adjacent first and second fingers. Both multi-finger capacitors 310 and 320 can be of substantially identical physical dimensions. In some examples, the interdigitating first and second fingers can be implemented as interdigitating first and second plates of conductive material.

First fingers associated with the first electrode 312 of the first capacitor 310 are denoted by reference sign 315. Second fingers associated with the second electrode 314 of the first capacitor 310 are denoted by reference sign 315'. Likewise, first fingers associated with the first electrode 322 of the second capacitor 320 are denoted by reference sign 325. Second fingers associated with the second electrode 324 of the second capacitor 320 are denoted by reference sign 325'. A first finger and an adjacent second finger, or vice versa, can be regarded as a finger pair. While both the first and the second capacitor 310 and 320 have an identical total number of finger pairs, the first and the second capacitor 310 and 320 still have different numbers of active/inactive finger pairs. An active finger pair is characterized in that both adjacent first and second fingers making up that pair are active, i.e. contributing to the respective capacitors signal capacitance. An inactive finger pair is characterized in that at least one of adjacent first and second fingers making up that pair is inactive, i.e. not contributing to the respective capacitors signal capacitance. While an active finger is connected to one of the respective capacitor's electrodes, an inactive finger is not connected to any of the respective capacitor's electrodes but is connected to AC ground, thereby contributing to the respective capacitor's parasitic capacitance.

It can be seen from FIG. 3 that the first multi-finger capacitor 310 and the second multi-finger capacitor 320 comprise an identical number of active first fingers 315, 325 being conductively connected to the respective first terminal 311, 321. In the illustrated example, even all first fingers 315, 325 of the first and second multi-finger capacitor 310, 320 are active fingers which are conductively connected to the first terminal 311, 321 of the respective multi-finger capacitor, the skilled person having benefit from the present disclosure will appreciate however that not necessarily all first fingers 315, 325 have to be active an other examples. Some of them could also be inactive (i.e., not connected to the respective first terminal 311, 321) as long as the numbers of active first fingers are identical between both capacitors 310, 320.

On the other hand, the first multi-finger capacitor 310 and second the second multi-finger capacitor 320 comprise different numbers of active second fingers 315, 325' being conductively connected to the respective second terminal 313, 323. The skilled person will appreciate that the different numbers of active second fingers lead to different numbers of active finger pairs and thus to different signal capacitances $C_{s,1}$ and $C_{s,2}$ of the first and second capacitor 310, 320. In the illustrated example, compared to the first capacitor 310, the second capacitor 320 comprises less active second fingers 325' being conductively connected to its second terminal 323. While in FIG. 3 all nine second fingers 315 of the first capacitor 310 are active (i.e., connected to terminal 313), leading to 16 active finger pairs of the first capacitor 310, only five second fingers 325' of the second capacitor 320 are active, leading to 8 active finger pairs of the first capacitor 320. Consequently, four second fingers 325' of the second capacitor 320 are inactive (i.e., not connected to terminal 313) and thus do not contribute to its signal capacitance $C_{s,2}$ which is thus smaller than the first signal capacitance Co. More generally, the number of respective inactive second fingers corresponds to a total number of second fingers minus the respective number of active second fingers.

According to examples of the present disclosure, the first and second capacitor 310, 320 need to have identical total capacitances, i.e., $C_{tot,1}=C_{tot,2}$. Therefore they need to have different parasitic capacitances $C_{p,1}$ and $C_{p,2}$. Assuming respective identical physical dimensions of the first and second multi-finger capacitor 310, 320, this can be achieved by different numbers of inactive second fingers 315, 325' of the respective capacitor 310, 320, which are connected to AC ground.

As can be further seen from FIG. 3, the respective first terminals 311, 321 of the first and the second multi-finger capacitor 310, 320 can be coupled to respective optional signal drivers 330, 340 of the same drive strength. In the illustrated example, all first fingers of the first multi-finger capacitor 310 are conductively connected to one or more first signal drivers 330 and all first fingers of the second multi-finger capacitor 320 are also conductively connected to one or more second signal drivers 340 of the same drive strength as the one or more first signal drivers 330. Identical drive strengths between the one or more first signal drivers 330 and the more second signal drivers 340 is feasible because both capacitors 310, 320 are "seen" with identical total capacitances, i.e., $C_{tot,1}=C_{tot,2}$, and hence identical input impedances.

Figure 4:
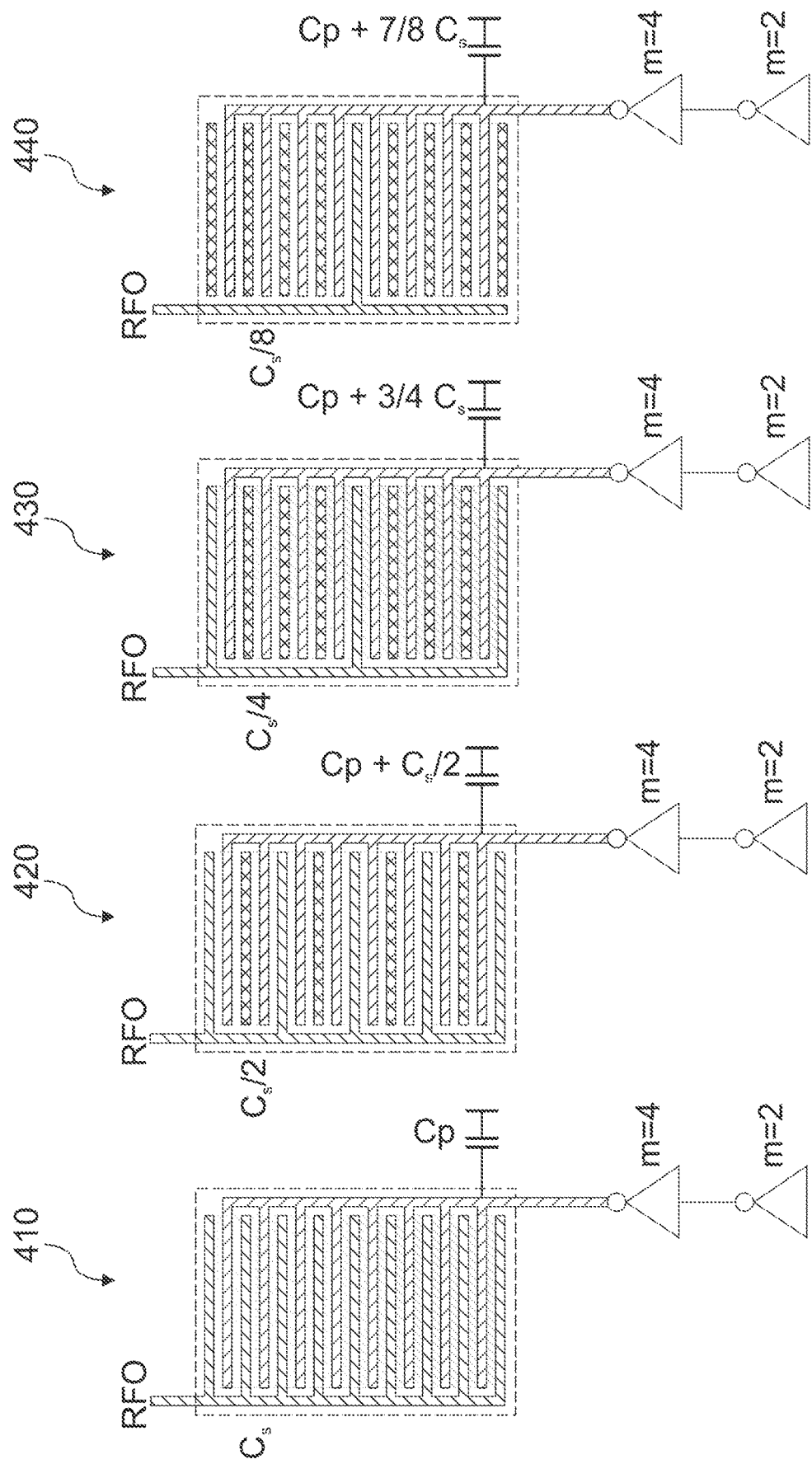
FIG. 4 shows four cells of a capacitive binary DAC in accordance with the present disclosure.

As mentioned before, examples of the present disclosure can be employed in data conversion circuits, such as DACs. FIG. 4 illustrates an example implementation of a 4-bit binary weighted DAC using the proposed capacitor scaling. The four illustrated multi-finger capacitors 410, 420, 430, 440 can be implemented using the same semiconductor process technology and can have substantially identical physical dimensions. The first multi-finger capacitor 410 comprises a first number of active fingers pairs (here: 16), the second multi-finger capacitor 420 comprises a different second number of active fingers pairs (here: 8), the third multi-finger capacitor 430 comprises yet a different third number of active fingers pairs (here: 4), and the fourth multi-finger capacitor 440 comprises still a different fourth number of active fingers pairs (here: 2). In the illustrated example, the respective numbers of active finger pairs correspond to different powers of 2, leading to a binary scaling of the respective signal capacitances. If the signal capacitance of the first capacitor 410 is $C_{s,1}=C_s$, then $C_{s,2}=C_s/2$, $C_{s,3}=C_s/4$, and $C_{s,4}=C_s/8$. Consequently, if the parasitic capacitance of the first capacitor 410 is $C_{p,1}=C_p$, then the proposed concept leads to $C_{p,2}=C_p+C_s/2$, $C_{p,3}=C_p+\frac{3}{4}C_s$, and $C_{p,4}=C_p+\frac{7}{8}C_s$. Thus, all total capacitances are substantially identical, $C_{tot,1}=C_{tot,2}=C_{tot,3}=C_{tot,4}$. The total capacitance seen by a driver in a full plurality of cells is as presented here only after neglecting the loading effect of the other branches. Example: one looks through driver 1, one sees $C_{p,1}$ in parallel with $C_{s,1}$ in series with ½ ¼ ... signal capacitances at the secondary side. This effect can be neglected, since there is quite a big parasitic capacitance at the secondary side, so that in the series of $C_{s,1}$ with ($C_{s,2}+C_{s,3}+...$), $C_{s,1}$ dominates.

FIG. 4 sketches one example layout implementation, but not the only viable one. The selection of the active fingers can differ based on specific layout requirements. At low powers, the effective capacitive load presented to the cell driver is the sum of the signal capacitance plus the parasitic capacitance $C_s+C_p=C_{s,max}*n/N+C_{p,min}+C_{s,max}(N-n)/N=C_{s,max}+C_{p,min}$, with $C_{s,max}$ being the maximum signal capacitance and $C_{p,min}$ being the minimum parasitic capacitance if all N output fingers are active, i.e. connected to the output terminal and thus contribute to the signal capacitance. n denotes the number of active fingers, with n≤N. Thus, this scaling method can provide a constant effective capacitive load, regardless of the signal capacitance scaling. As a consequence, the driver and pre-drivers if present of the respective cells do not need to be scaled (FIG. 4), thus overcoming an inherent limitation to conventional cell scaling. Given a constant effective capacitive load and a constant driver strength, the signal generated by the cells are substantially phased-aligned by construction.

Some examples of the proposed capacitor scaling for multi-finger capacitors can be implemented as follows:

(1) all N input fingers of the input-plate of the capacitor can always be connected to the driver, regardless of the cell scaling, (2) the capacitor's signal capacitance $C_s$ is thus scaled by connecting to the output terminal n output fingers of the output-plate, thus $C_s=C_{s,max}*n/N$, with $C_{s,max}$ being the maximum signal capacitance if all output fingers are active;

(3) the unused (N−n) output-plate fingers can be ac-grounded to contribute to the parasitic capacitance at the input-plate $C_p=C_{p,min}(N-n)/N$, with $C_{p,min}$ being the minimum parasitic capacitance if all N output fingers are active;

(4) no floating metal fingers are used.

By avoiding the use of any floating dummy metal fingers, the proposed scaling methodology can yield superior control on the signal cap as well in comparison to conventional scaling concepts.

Figure 5:
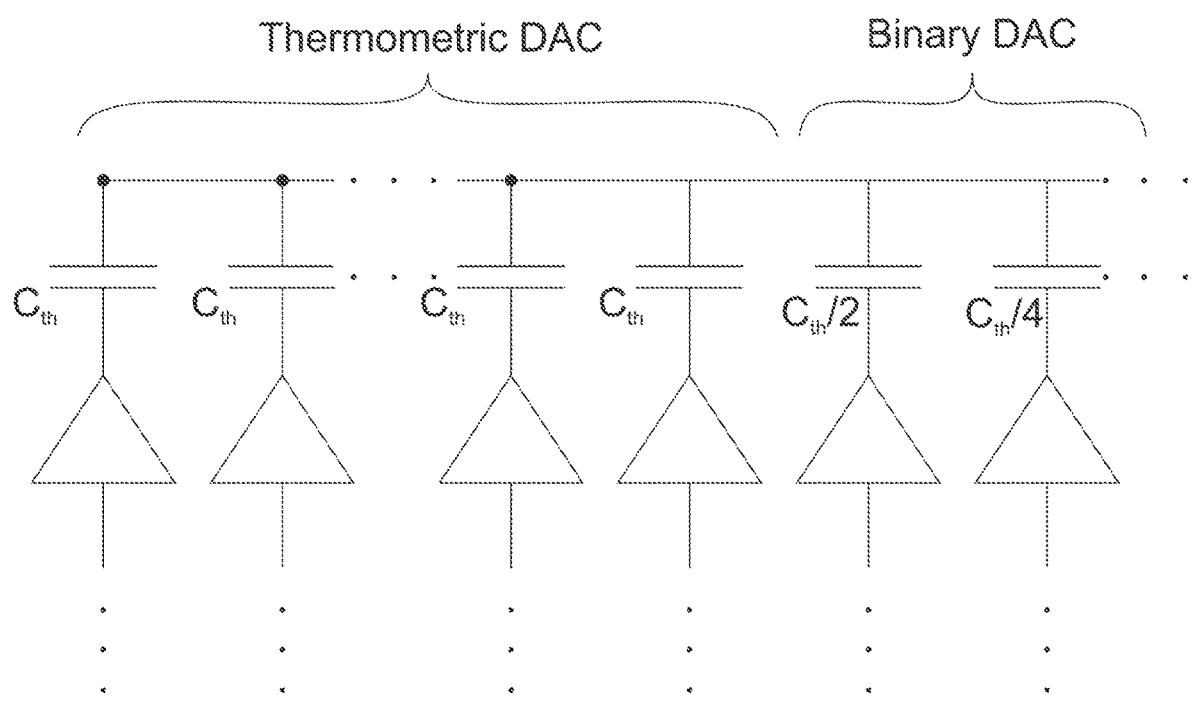
FIG. 5 illustrates an example of a segmented DAC.

The proposed capacitor scaling concept can be advantageously used also for segmented capacitive DACs where, for example, binary-scaled cells can be implemented as a downscaled version of thermometric cells. The principle of such a segmented capacitive DACs 500 is shown in FIG. 5. The skilled person having benefit from the present disclosure will appreciate that different types of segmentations exist, even though thermometric+binary is a fairly common one.

A thermometric capacitive DAC segment can handle the MSBs, a binary capacitive DAC segment can handle the LSBs, and their outputs can be added in some way. The skilled person having benefit from the present disclosure will appreciate that it could also be the opposite way, for example. In a capacitive DAC used in RF DAC implementations each cell toggles the input-plate of the respective capacitor at LO-rate and provides a portion of the output signal current to a load. The output voltage of each cell ideally needs to be in-phase with the other cells. The phase alignment can be achieved by having all the input-plates charged and discharged simultaneously and at the same speed. At low powers, where the contribution of the binary-segment can be significant, during the charge/discharge phase of the input-plate, each active driver sees an effective capacitive load given by the sum of the respective signal capacitance and the respective parasitic capacitance at the input-plate.

Figure 6:
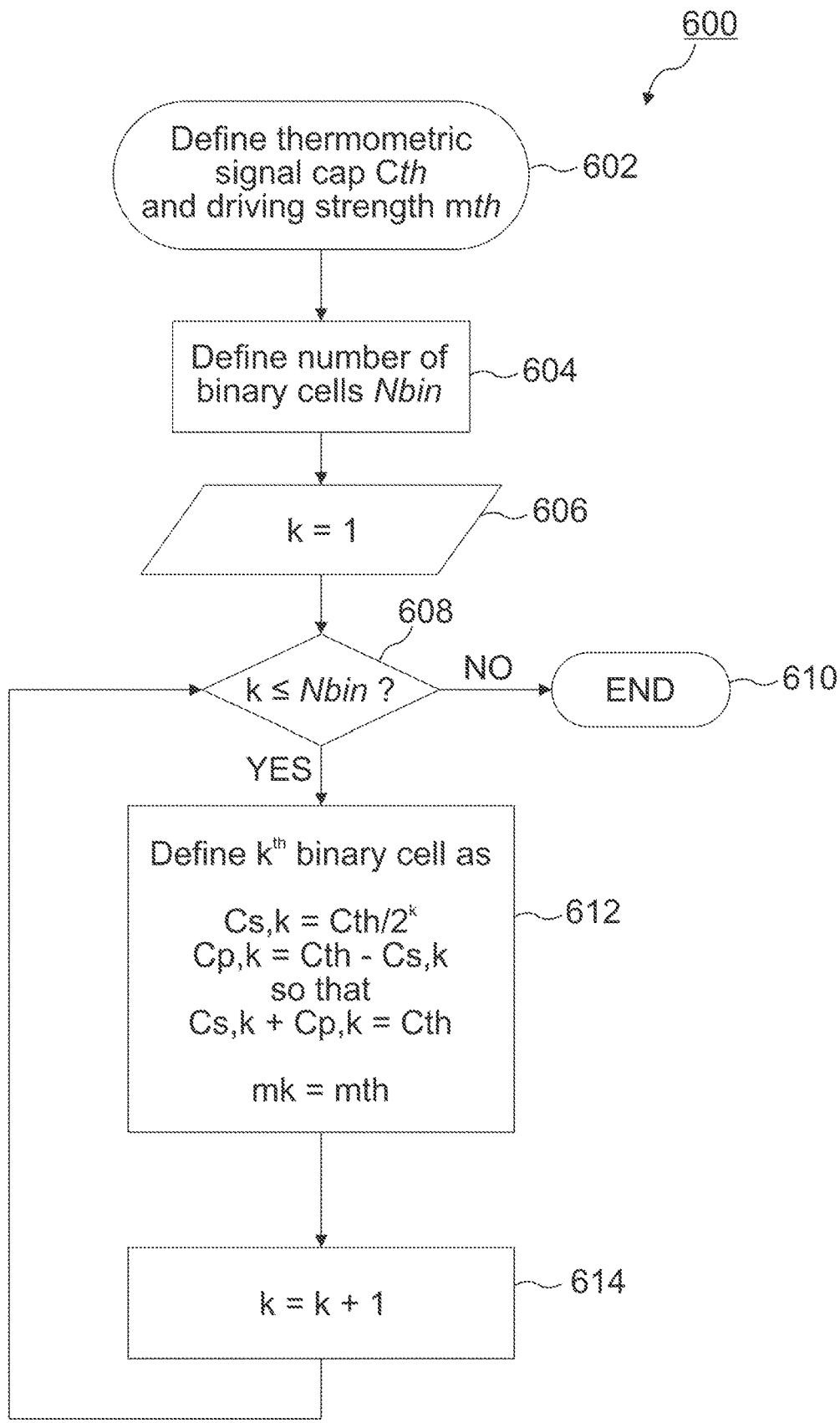
FIG. 6 shows a flow-chart of an example methodology for capacitive DAC cell-scaling.

FIG. 6 sketches a flowchart 600 for the novel methodology introduced for cell scaling, aimed at achieving a superior phase alignment between binary- and thermometric-segment by construction. The flowchart assumes that the proposed concept is adopted for the binary weighted cells but it can be extended to any coding scheme.

In FIG. 6, $C_{th}$ denotes the capacitance of a thermometric cell. This capacitance $C_{th}$ is driven by one or more signal drivers of strength $m_{th}$ (see reference numeral 602). $N_{bin}$ denotes the number of binary cells of the binary segment (see reference numeral 604). The process 600 starts at counter k=1 (see reference numeral 606). k is compared to $N_{bin}$. (see reference numeral 608) If k is larger than $N_{bin}$, the process ends (see reference numeral 610). Otherwise, the signal capacitance $C_{s,k}$ of the k-th binary cell can be defined as $C_{th}/2^k$. The additional parasitic capacitance $C_{p,k}$ of the k-th binary cell can be defined as $C_{th}-C_{s,k}$, leading to $C_{s,k}+C_{p,k}=C_{th}$. The signal driver strength of the k-th binary cell corresponds to $m_{th}$ (see reference numeral 612). In act 614 the counter k can be increased.

By maintaining the sum of the respective signal capacitance and the respective parasitic capacitance constant for varying signal capacitances, examples of the present disclosure provide a concept for implementing the capacitive DAC binary-weighted cells, achieving superior phase alignment between the binary- and the thermometric-segment and among binary cells as well. The proposed concept can provide a constant capacitive load to the signal drivers of the binary-weighted cells, while down-scaling the signal capacitance. As a consequence, down-scaling the driver strength is unnecessary, thus overcoming the limitations inherent to the sub-optimal scaling of active devices.

Examples of the present disclosure can achieve superior phase-alignment between binary and thermometric-segment by construction. The new binary-weighted cells are less sensitive to parasitic capacitances and show better matching to the thermometric cells, thus enabling better amplitude scaling as well. The transmitter features superior linearity at low powers, getting rid of the hardly-predictable EVM and ACLR degradation, thus enabling either larger margin to spec or tougher specs and easing the gain calibration strategy of the system. Embodiments of the present disclosure may thus also be interesting for DACs in transceivers supporting higher modulation schemes, which will need to fulfill tight linearity specifications, as well as for C-DACs operating at high clock rates, thus being way more sensitive to time misalignments.

Figure 7:
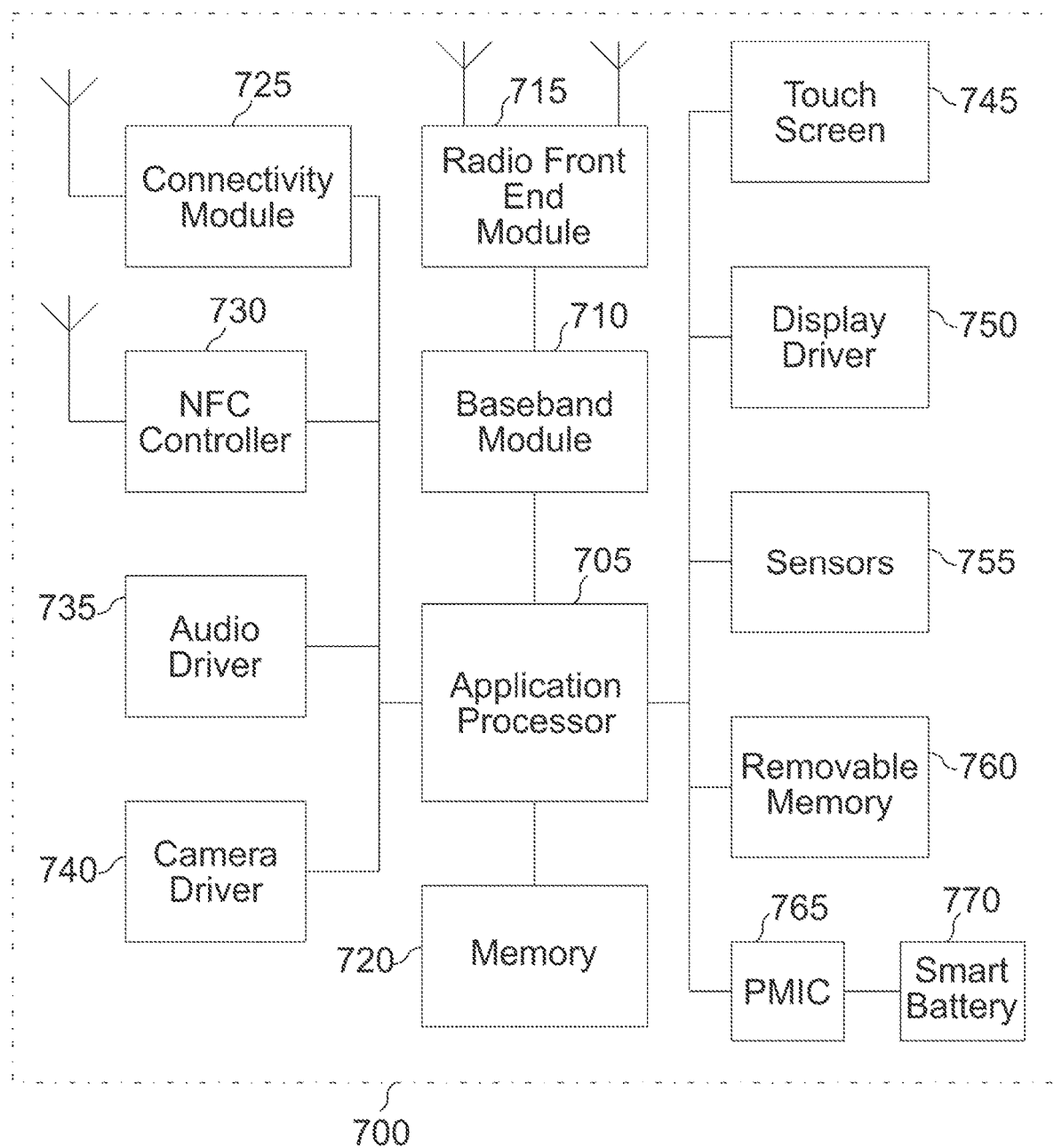
FIG. 7 illustrates a user device in accordance with an aspect.

FIG. 7 illustrates a user device 700 in accordance with an aspect in which examples of the proposed capacitor scaling may be implemented. The user device 700 may be a mobile device in some aspects and includes an application processor 705, baseband processor 710 (also referred to as a baseband module), radio front end module (RFEM) 715, memory 720, connectivity module 725, near field communication (NFC) controller 730, audio driver 735, camera driver 740, touch screen 745, display driver 750, sensors 755, removable memory 760, power management integrated circuit (PMIC) 765 and smart battery 770.

In some aspects, application processor 705 may include, for example, one or more CPU cores and one or more of cache memory, low drop-out voltage regulators (LDOs), interrupt controllers, serial interfaces such as serial peripheral interface (SPI), inter-integrated circuit (I²C) or universal programmable serial interface module, real time clock (RTC), timer-counters including interval and watchdog timers, general purpose input-output (TO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 710 may be implemented, for example, as a solder-down substrate including one or more integrated circuits, a single packaged integrated circuit soldered to a main circuit board, and/or a multi-chip module containing two or more integrated circuits.

Figure 8:
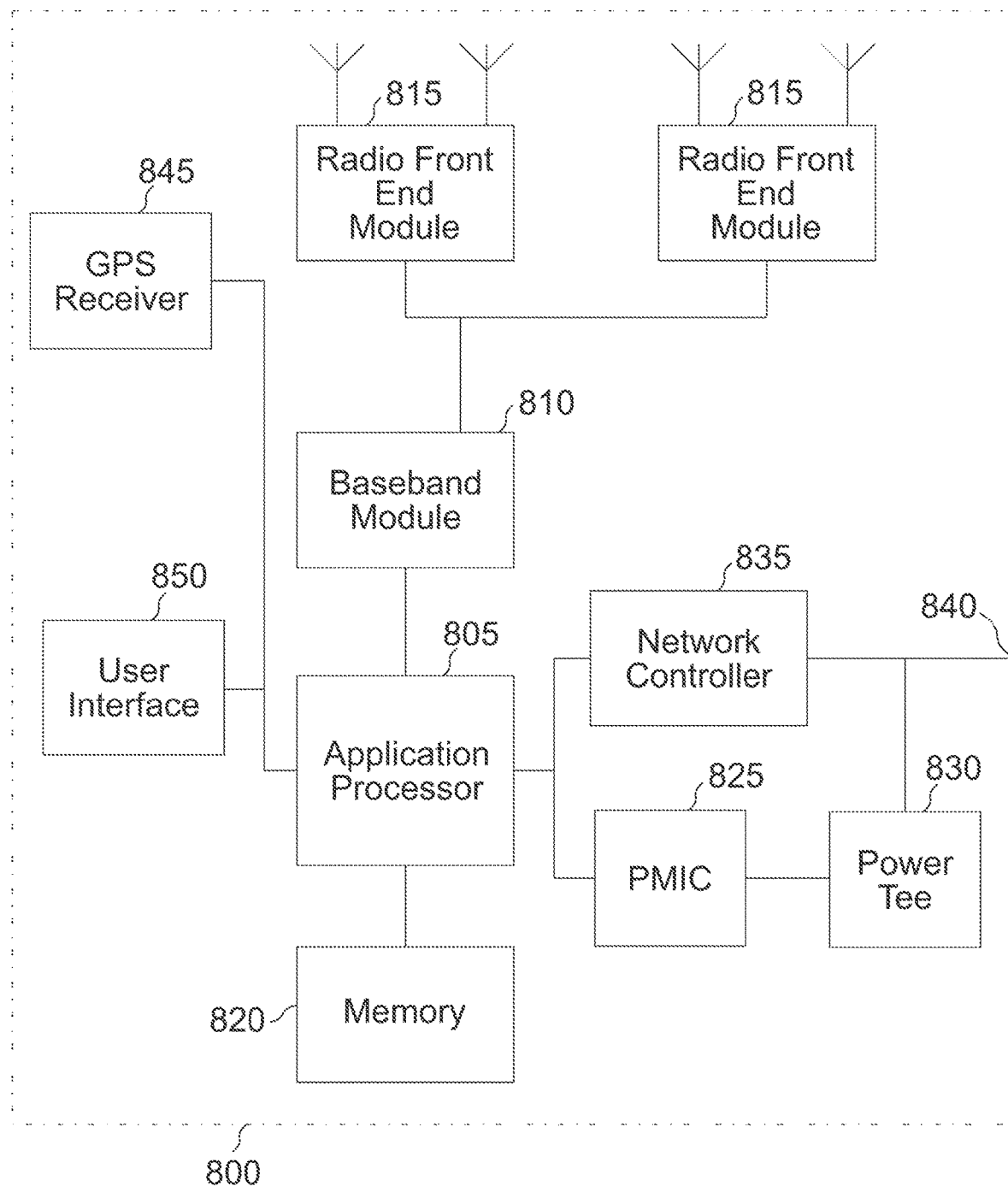
FIG. 8 illustrates a base station or infrastructure equipment radio head in accordance with an aspect.

FIG. 8 illustrates a base station or infrastructure equipment radio head 800 in which examples of the proposed capacitor scaling may be implemented. The base station radio head 800 may include one or more of application processor 805, baseband modules 810, one or more radio front end modules 815, memory 820, power management circuitry 825, power tee circuitry 830, network controller 835, network interface connector 840, satellite navigation receiver module 845, and user interface 850.

In some aspects, application processor 805 may include one or more CPU cores and one or more of cache memory, low drop-out voltage regulators (LDOs), interrupt controllers, serial interfaces such as SPI, I²C or universal programmable serial interface module, real time clock (RTC), timer-counters including interval and watchdog timers, general purpose TO, memory card controllers such as SD/MMC or similar, USB interfaces, MIPI interfaces and Joint Test Access Group (JTAG) test access ports.

In some aspects, baseband processor 810 may be implemented, for example, as a solder-down substrate including one or more integrated circuits, a single packaged integrated circuit soldered to a main circuit board or a multi-chip module containing two or more integrated circuits.

In some aspects, memory 820 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 820 may be implemented as one or more of solder down packaged integrated circuits, socketed memory modules and plug-in memory cards.

In some aspects, power management integrated circuitry 825 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 830 may provide for electrical power drawn from a network cable to provide both power supply and data connectivity to the base station radio head 800 using a single cable.

In some aspects, network controller 835 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 845 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 845 may provide data to application processor 805 which may include one or more of position data or time data. Application processor 805 may use time data to synchronize operations with other radio base stations. In some aspects, user interface 850 may include one or more of physical or virtual buttons, such as a reset button, one or more indicators such as light emitting diodes (LEDs) and a display screen.

Figure 9A:
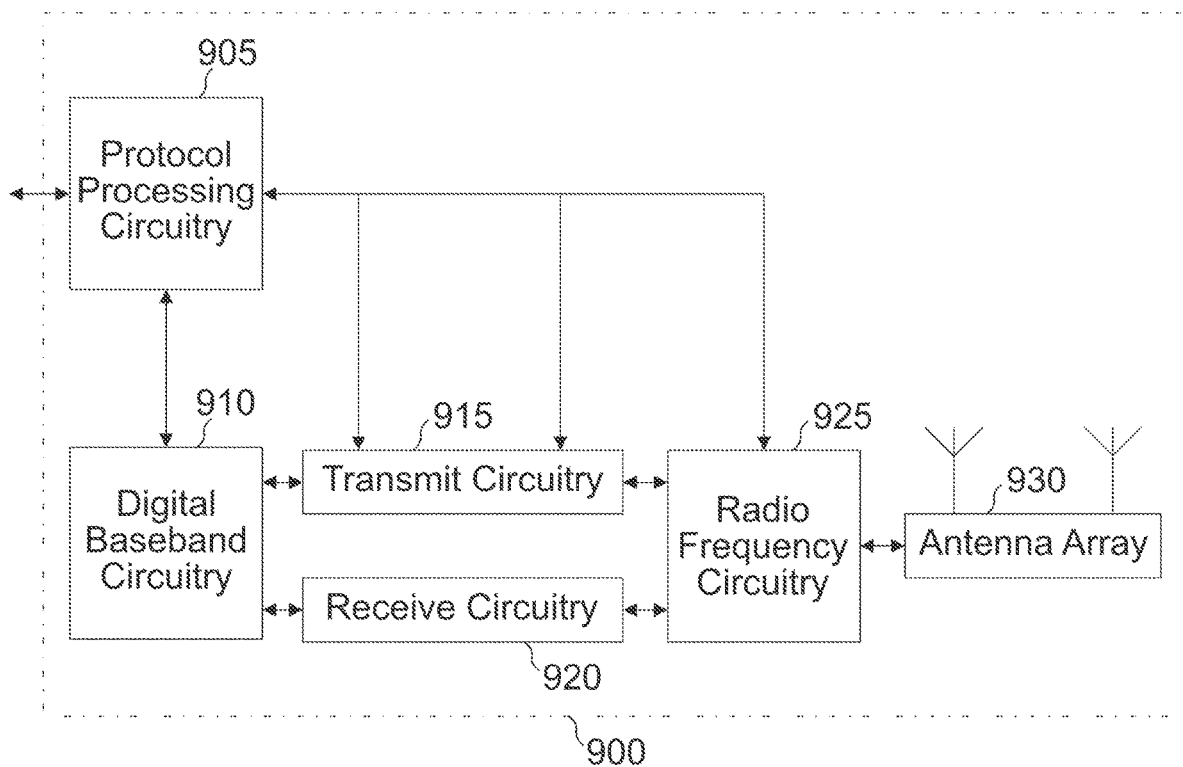
FIG. 9a illustrates an exemplary millimeter wave communication circuitry according to some aspects.

FIG. 9A illustrates an exemplary millimeter wave communication circuitry 900 in which examples of the proposed capacitor scaling may be implemented. Circuitry 900 is alternatively grouped according to functions. Components as shown in 900 are shown here for illustrative purposes and may include other components not shown here in FIG. 9A.

Millimeter wave communication circuitry 900 may include protocol processing circuitry 905, which may implement one or more of medium access control (MAC), radio link control (RLC), packet data convergence protocol (PDCP), radio resource control (RRC) and non-access stratum (NAS) functions. Protocol processing circuitry 905 may include one or more processing cores (not shown) to execute instructions and one or more memory structures (not shown) to store program and data information.

Millimeter wave communication circuitry 900 may further include digital baseband circuitry 910, which may implement physical layer (PHY) functions including one or more of hybrid automatic repeat request (HARD) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 900 may further include transmit circuitry 915, receive circuitry 920 and/or antenna array circuitry 930.

Millimeter wave communication circuitry 900 may further include radio frequency (RF) circuitry 925. In an aspect of the invention, RF circuitry 925 may include multiple parallel RF chains for one or more of transmit or receive functions, each connected to one or more antennas of the antenna array 930.

In an aspect of the disclosure, protocol processing circuitry 905 may include one or more instances of control circuitry (not shown) to provide control functions for one or more of digital baseband circuitry 910, transmit circuitry 915, receive circuitry 920, and/or radio frequency circuitry 925.

Figure 9B:
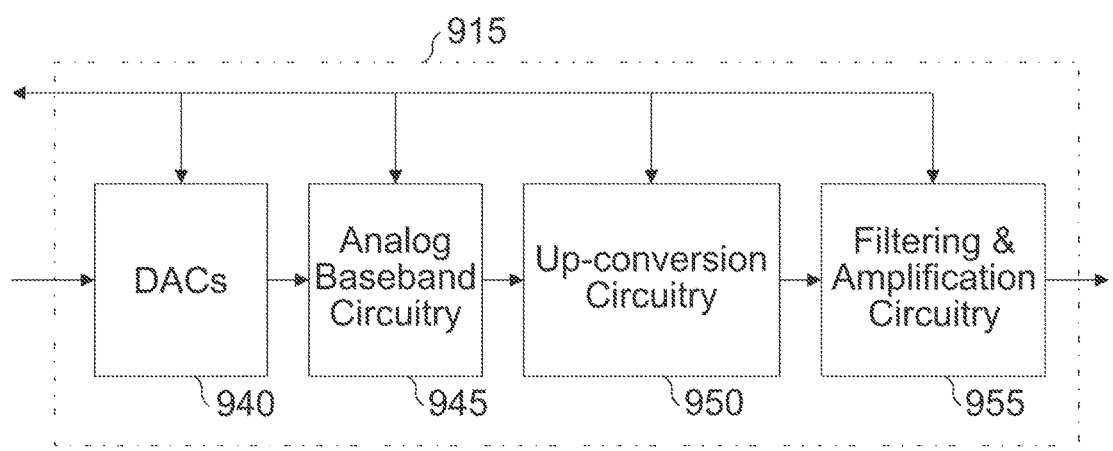
FIG. 9b, c illustrate examples for transmit circuitry in some aspects.
Figure 9C:
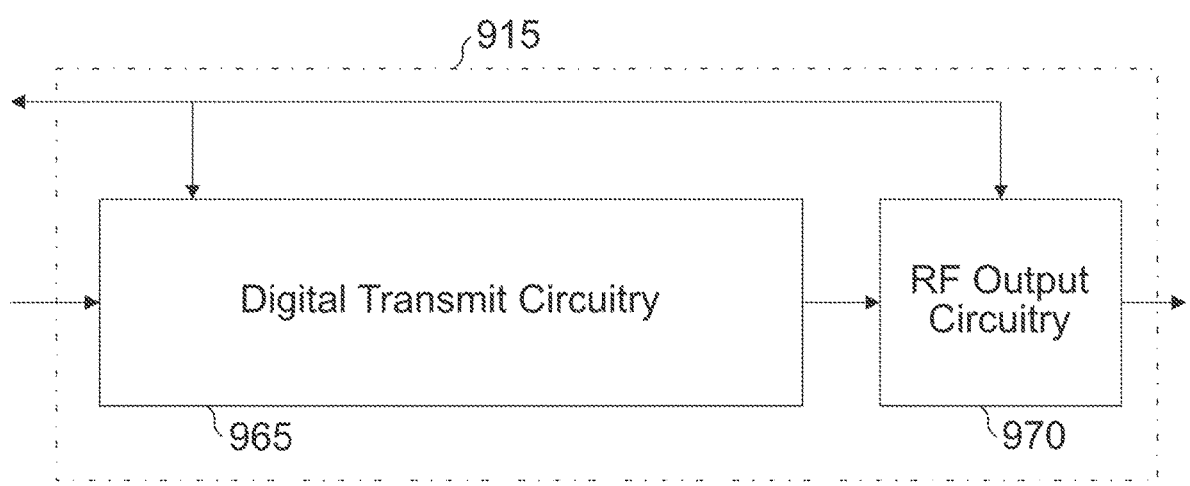

FIGS. 9B and 9C illustrate examples for transmit circuitry 915 in FIG. 9A in some aspects.

The exemplary transmit circuitry 915 of FIG. 9B may include one or more of digital to analog converters (DACs) 940 in which examples of the proposed capacitor scaling may be implemented, analog baseband circuitry 945, up-conversion circuitry 950 and filtering and amplification circuitry 955. In another aspect, 9C illustrates an exemplary transmit circuitry 915 which includes digital transmit circuitry 965 and output circuitry 970

The following examples pertain to further embodiments.

Example 1 is an electrical circuit comprising a first capacitor which exhibits a first signal capacitance between a first electrode and a second electrode of the first capacitor and which exhibits a first parasitic capacitance between the first capacitor's first electrode and AC ground. A sum of the first signal capacitance and the first parasitic capacitance yields a first total capacitance. The electrical circuit also comprises a second capacitor which exhibits a second signal capacitance between a first electrode and a second electrode of the second capacitor and which exhibits a second parasitic capacitance between the second capacitor's first electrode and AC ground. A sum of the second signal capacitance and the second parasitic capacitance yields a second total capacitance. The first signal capacitance differs from the second signal capacitance while the first total capacitance equals the second total capacitance.

In Example 2, the first electrode of the first capacitor Example 1 is optionally coupled to a first signal driver and the first electrode of the second capacitor is optionally coupled to a second signal driver. The first and the second signal driver have identical drive strength.

In Example 3, respective physical dimensions of the first and second signal driver of Example 2 are identical.

In Example 4, respective physical dimensions of the first and second capacitor of any one of the previous Examples are identical.

In Example 5, the electrical circuit of any one of the previous Examples is a digital-to-analog converter circuit or an analog-to-digital converter circuit.

Example 6 is a system comprising the electrical circuit of any one of the previous Examples.

In Example 7, first capacitor of any one of the previous Examples is a first multi-finger capacitor having a first terminal coupled to its first electrode and a second terminal coupled to its second electrode. The second capacitor of any one of the previous Examples is a second multi-finger capacitor having a first terminal coupled to its first electrode and a second terminal coupled to its second electrode. The first multi-finger capacitor and the second multi-finger capacitor comprise an identical number of respective inter-digitating first and second fingers between the respective first and second terminals. The first multi-finger capacitor and second the second multi-finger capacitor comprise an identical number of active first fingers being conductively connected to the respective first terminal. The first multi-finger capacitor and second the second multi-finger capacitor comprise different numbers of inactive second fingers being conductively connected to AC ground.

In Example 8, all first fingers of the first and second multi-finger capacitor of Example 7 are active fingers being conductively connected to the first terminal of the respective multi-finger capacitor.

In Example 9, the first multi-finger capacitor and second the second multi-finger capacitors of Example 7 or 8 comprise different numbers of active second fingers being conductively connected to the respective second terminal.

In Example 10, the number of respective inactive second fingers of Example 9 corresponds to a total number of second fingers minus the respective number of active second fingers.

In Example 11, the first multi-finger capacitor of any one of the Examples 7 to 10 comprises a first number of active fingers pairs and the second multi-finger capacitor of any one of the Examples 7 to 10 comprises a different second number of active fingers pairs. A respective active finger pair is formed by a respective active first finger adjacently arranged to a respective active second finger. The first and the second number of active finger pairs correspond to different powers of 2.

In Example 12, the first and second multi-finger capacitors of any one of the Examples 7 to 11 are part of a binary capacitive digital-to-analog converter circuit.

In Example 13, the respective first terminals of the first and the second multi-finger capacitor of any one of the Examples 7 to 12 are coupled to respective signal drivers of the same drive strength.

In Example 14, the electrical circuit of any one of the Examples 7 to 13 further comprises one or more first signal drivers and one or more second signal drivers. All first fingers of the first multi-finger capacitor are conductively connected to the one or more first signal drivers. All first fingers of the second multi-finger capacitor are conductively connected to the one or more second signal drivers.

In Example 15, the respective physical dimensions of the first and second multi-finger capacitor of any one of the Examples 7 to 14 are identical.

Example 16 is an electrical circuit comprising a first capacitor having a first signal capacitance between an input electrode and an output electrode of the first capacitor and a first parasitic capacitance between the first capacitor's input electrode and AC ground. A sum of the first signal capacitance and the first parasitic capacitance yields a first total capacitance. The electrical circuit further comprises a second capacitor having a second signal capacitance between an input electrode and an output electrode of the second capacitor and a second parasitic capacitance between the second capacitor's input electrode and AC ground. A sum of the second signal capacitance and the second parasitic capacitance yields a second total capacitance. The first signal capacitance differs from the second signal capacitance while the first total capacitance equals the second total capacitance. A first signal driver connected is to the input electrode of the first capacitor and a second signal driver is connected to the input electrode of the second capacitor. A drive strength of the first signal driver equals a drive strength of the second signal driver.

In Example 17, the first signal driver and the first capacitor are arranged in a first branch of the electrical circuit of Example 15 and the second signal driver and the second capacitor are arranged in a second branch of the electrical circuit parallel to the first branch.

In Example 18, the electrical circuit of Example 16 or 17 is comprised of a digital-to-analog converter circuit or an analog-to-digital converter circuit.

Example 19 is a method for forming an electrical circuit. The method includes providing a first capacitor with a first signal capacitance between a first electrode and a second electrode of the first capacitor and with a first parasitic capacitance between the first capacitor's first electrode and AC ground. A sum of the first signal capacitance and the first parasitic capacitance yields a first total capacitance. The method further includes providing a second capacitor with a second signal capacitance between a first electrode and a second electrode of the second capacitor and with a second parasitic capacitance between the second capacitor's first electrode and AC ground. A sum of the second signal capacitance and the second parasitic capacitance yields a second total capacitance. The first signal capacitance differs from the second signal capacitance while the first total capacitance equals the second total capacitance.

In Example 20, the method of Example 19 optionally further includes connecting the first capacitor's first electrode to one or more first signal drivers and connecting the second capacitor's first electrode to one or more second signal drivers having the same drive strength as the one or more first signal drivers.

In Example 21, providing the first capacitor of Examples 19 or 20 optionally further comprises providing a first multi-finger capacitor having a first terminal and a second terminal. Providing the second capacitor of Examples 18 or 19 optionally further comprises providing a second multi-finger capacitor having a first terminal and a second terminal. The first multi-finger capacitor and the second multi-finger capacitor comprise an identical number of respective interdigitating first and second fingers between the respective first and second terminals. The method of Examples 18 or 19 optionally further comprises conductively connecting an identical number of respective first fingers of the respective multi-finger capacitor to the respective first terminal and adjusting different first and second signal capacitances of the first and second multi-finger capacitor by disconnecting different numbers of respective second fingers of the respective multi-finger capacitor from the respective second capacitor terminal.

In Example 22, the method of Example 21 optionally further comprises conductively connecting all first fingers of the respective multi-finger capacitor to the respective first terminal.

In Example 23, adjusting the different first and second signal capacitances of the first and second multi-finger capacitor of Examples 21 or 22 comprises conductively connecting different numbers of respective second fingers of the respective multi-finger capacitor to its respective second terminal.

In Example 24, connected first and second fingers of any one of Example 21 to 23 form active finger pairs and wherein adjusting the different first and second signal capacitances comprises forming different numbers of active fingers pairs between the first and the second multi-finger capacitor.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. An electrical circuit, comprising:
a first capacitor exhibiting a first signal capacitance between a first electrode and a second electrode of the first capacitor and exhibiting a first parasitic capacitance between the first capacitor's first electrode and AC ground, wherein a sum of the first signal capacitance and the first parasitic capacitance yields a first total capacitance; a second capacitor exhibiting a second signal capacitance between a first electrode and a second electrode of the second capacitor and exhibiting a second parasitic capacitance between the second capacitor's first electrode and AC ground, wherein a sum of the second signal capacitance and the second parasitic capacitance yields a second total capacitance;
wherein the first signal capacitance differs from the second signal capacitance, and
wherein the first total capacitance equals the second total capacitance.

2. The electrical circuit of claim 1, wherein the first electrode of the first capacitor is coupled to a first signal driver, wherein the first electrode of the second capacitor is coupled to a second signal driver, and wherein the first and the second signal driver have identical drive strength.

3. The electrical circuit of claim 2, wherein respective physical dimensions of the first and second signal driver are identical.

4. The electrical circuit of claim 1, wherein respective physical dimensions of the first and second capacitor are identical.

5. The electrical circuit of claim 1, wherein the electrical circuit is a digital-to-analog converter circuit.

6. The electrical circuit of claim 1, wherein the first capacitor is a first multi-finger capacitor having a first terminal coupled to its first electrode and a second terminal coupled to its second electrode, wherein the second capacitor is a second multi-finger capacitor having a first terminal coupled to its first electrode and a second terminal coupled to its second electrode;

wherein the first multi-finger capacitor and the second multi-finger capacitor comprise an identical number of respective interdigitating first and second fingers between the respective first and second terminals;
wherein the first multi-finger capacitor and second the second multi-finger capacitor comprise an identical number of active first fingers being conductively connected to the respective first terminal; and
wherein the first multi-finger capacitor and second the second multi-finger capacitor comprise different numbers of inactive second fingers being conductively connected to AC ground.

7. The electrical circuit of claim 6, wherein all first fingers of the first and second multi-finger capacitor are active fingers being conductively connected to the first terminal of the respective multi-finger capacitor.

8. The electrical circuit of claim 6, wherein the first multi-finger capacitor and second the second multi-finger capacitors comprise different numbers of active second fingers being conductively connected to the respective second terminal.

9. The electrical circuit of claim 8, wherein the number of respective inactive second fingers corresponds to a total number of second fingers minus the respective number of active second fingers.

10. The electrical circuit of claim 6, wherein the first multi-finger capacitor comprises a first number of active fingers pairs and the second multi-finger capacitor comprises a different second number of active fingers pairs, a respective active finger pair being formed by a respective active first finger adjacently arranged to a respective active second finger, wherein the first and the second number of active finger pairs correspond to different powers of 2.

11. The electrical circuit of claim 6, wherein the first and second multi-finger capacitors are part of a binary capacitive digital-to-analog converter circuit.

12. The electrical circuit of claim 6, wherein the respective first terminals of the first and the second multi-finger capacitor are coupled to respective signal drivers of the same drive strength.

13. The electrical circuit of claim 6, further comprising one or more first signal drivers;
one or more second signal drivers,
wherein all first fingers of the first multi-finger capacitor are conductively connected to the one or more first signal drivers, and
wherein all first fingers of the second multi-finger capacitor are conductively connected to the one or more second signal drivers.

14. The electrical circuit of claim 6, wherein respective physical dimensions of the first and second multi-finger capacitor are identical.

15. An electrical circuit, comprising:
a first capacitor having a first signal capacitance between an input electrode and an output electrode of the first capacitor and a first parasitic capacitance between the first capacitor's input electrode and AC ground, wherein a sum of the first signal capacitance and the first parasitic capacitance yields a first total capacitance;
a second capacitor having a second signal capacitance between an input electrode and an output electrode of the second capacitor and a second parasitic capacitance between the second capacitor's input electrode and AC ground, wherein a sum of the second signal capacitance and the second parasitic capacitance yields a second total capacitance, wherein the first signal capacitance differs from the second signal capacitance and wherein the first total capacitance equals the second total capacitance;

a first signal driver connected to the input electrode of the first capacitor; and a second signal driver connected to the input electrode of the second capacitor, wherein a drive strength of the first signal driver equals a drive strength of the second signal driver.

16. The electrical circuit of claim 15, wherein the first signal driver and the first capacitor are arranged in a first branch of the electrical circuit and wherein the second signal driver and the second capacitor are arranged in a second branch of the electrical circuit parallel to the first branch.

17. The electrical circuit of claim 15, wherein the electrical circuit is a digital-to-analog converter circuit.

18. Method for forming an electrical circuit, the method comprising:

providing a first capacitor with a first signal capacitance between a first electrode and a second electrode of the first capacitor and with a first parasitic capacitance between the first capacitor's first electrode and AC ground, wherein a sum of the first signal capacitance and the first parasitic capacitance yields a first total capacitance; providing a second capacitor with a second signal capacitance between a first electrode and a second electrode of the second capacitor and with a second parasitic capacitance between the second capacitor's first electrode and AC ground, wherein a sum of the second signal capacitance and the second parasitic capacitance yields a second total capacitance;

wherein the first signal capacitance differs from the second signal capacitance, and wherein the first total capacitance equals the second total capacitance.

19. The method of claim 18, comprising connecting the first capacitor's first electrode to one or more first signal drivers and connecting the second capacitor's first electrode to one or more second signal drivers having the same drive strength as the one or more first signal drivers.

20. The method of claim 18, wherein providing the first capacitor comprises providing a first multi-finger capacitor having a first terminal and a second terminal;

wherein providing the second capacitor comprises providing a second multi-finger capacitor having a first terminal and a second terminal, wherein the first multi-finger capacitor and the second multi-finger capacitor comprise an identical number of respective interdigitating first and second fingers between the respective first and second terminals;

conductively connecting an identical number of respective first fingers of the respective multi-finger capacitor to the respective first terminal; and adjusting different first and second signal capacitances of the first and second multi-finger capacitor by disconnecting different numbers of respective second fingers of the respective multi-finger capacitor from the respective second capacitor terminal.

* * * * *